US010127101B2

(12) United States Patent
Halbert et al.

(10) Patent No.: US 10,127,101 B2
(45) Date of Patent: Nov. 13, 2018

(54) MEMORY DEVICE ERROR CHECK AND SCRUB MODE AND ERROR TRANSPARENCY

(71) Applicant: Intel Corporation, Santa Clara, CA (US)

(72) Inventors: John B Halbert, Beaverton, OR (US); Kuljit S Bains, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 34 days.

(21) Appl. No.: 14/998,184

(22) Filed: Dec. 26, 2015

(65) Prior Publication Data

US 2017/0060681 A1    Mar. 2, 2017

Related U.S. Application Data

(60) Provisional application No. 62/211,448, filed on Aug. 28, 2015.

(51) Int. Cl.
*H03M 13/00* (2006.01)
*G06F 11/10* (2006.01)
(Continued)

(52) U.S. Cl.
CPC .......... *G06F 11/1048* (2013.01); *G06F 3/064* (2013.01); *G06F 3/0619* (2013.01); *G06F 3/0679* (2013.01); *G06F 11/1068* (2013.01); *G11C 29/42* (2013.01); *G11C 29/52* (2013.01); *H03M 13/095* (2013.01); *H03M 13/6566* (2013.01); *G11C 11/401* (2013.01)

(58) Field of Classification Search
CPC .. G06F 11/1068; G06F 3/0619; G06F 3/0679; G06F 3/064; H03M 13/6566; H03M 13/095; G11C 29/52
See application file for complete search history.

(56) References Cited

U.S. PATENT DOCUMENTS 5,638,385 A    6/1997 Fifield et al.
6,052,818 A    4/2000 Dell et al.
(Continued)

OTHER PUBLICATIONS

International Search Report and Written Opinion for PCT Patent Application No. PCT/US2016/045639, dated Nov. 7, 2016, 12 pages.
(Continued)

*Primary Examiner* — Thien Nguyen
(74) *Attorney, Agent, or Firm* — Compass IP Law PC

(57) ABSTRACT

An error check and scrub (ECS) mode enables a memory device to perform error checking and correction (ECC) and count errors. An associated memory controller triggers the ECS mode with a trigger sent to the memory device. The memory device includes multiple addressable memory locations, which can be organized in segments such as wordlines. The memory locations store data and have associated ECC information. In the ECS mode, the memory device reads one or more memory locations and performs ECC for the one or more memory locations based on the ECC information. The memory device counts error information including a segment count indicating a number of segments having at least a threshold number of errors, and a maximum count indicating a maximum number of errors in any segment.

23 Claims, 8 Drawing Sheets

(51) Int. Cl.

| | | |
|---|---|---|
| *G11C 29/52* | (2006.01) | |
| *G06F 3/06* | (2006.01) | |
| *H03M 13/09* | (2006.01) | |
| *G11C 29/42* | (2006.01) | |
| *G11C 11/401* | (2006.01) | |

(56) References Cited

U.S. PATENT DOCUMENTS

| | | |
|---|---|---|
| 6,487,685 B1 | 11/2002 | Fiske et al. |
| 6,957,378 B2 | 10/2005 | Koga et al. |
| 7,096,407 B2 | 8/2006 | Wig |
| 7,650,558 B2 | 1/2010 | Rosenbluth et al. |
| 8,640,005 B2 | 1/2014 | Wilkerson et al. |
| 2005/0144551 A1* | 6/2005 | Nahas ............... G06F 11/1008 714/763 |
| 2007/0234182 A1 | 10/2007 | Wickeraad et al. |
| 2008/0229176 A1 | 9/2008 | Arnez et al. |
| 2009/0249169 A1 | 10/2009 | Bains et al. |
| 2010/0257432 A1 | 10/2010 | Resnick |
| 2012/0054580 A1 | 3/2012 | Sakaue |
| 2013/0111308 A1 | 5/2013 | Sauber et al. |
| 2013/0132797 A1 | 5/2013 | Arai |
| 2014/0122974 A1 | 5/2014 | Yun |
| 2014/0211579 A1* | 7/2014 | Lovelace ......... G11C 11/40607 365/200 |
| 2014/0337688 A1 | 11/2014 | Billing et al. |
| 2015/0052415 A1* | 2/2015 | Um .................... G06F 11/1056 714/768 |
| 2015/0067437 A1 | 3/2015 | Bains et al. |
| 2015/0243373 A1* | 8/2015 | Chun ................. G06F 12/0246 714/710 |
| 2015/0331732 A1* | 11/2015 | Giovannini .......... G11C 11/406 714/704 |
| 2016/0048425 A1 | 2/2016 | Kim et al. |
| 2016/0224412 A1* | 8/2016 | Healy ............... G06F 11/1008 |
| 2016/0239663 A1* | 8/2016 | Healy ............... G06F 21/554 |

OTHER PUBLICATIONS

International Search Report and Written Opinion for PCT Patent Application No. PCT/US2016/045640, dated Nov. 14, 2016, 13 pages.
International Search Report and Written Opinion for PCT Patent Application No. PCT/US2016/045643, dated Nov. 16, 2016, 15 pages.

* cited by examiner

COMMAND ENCODING 410

| CMD | CKE CK_t (n-1) | CKE CK_t (n) | CS_n | ACT_n | RAS_n /A16 | CAS_n /A15 | WE_n /A14 | BG0-BG2 | BA0-BA1 | C2-C0 | A12/ BC_n | A17, A13, A11 | A10 /AP | A0-A9 |
|---|---|---|---|---|---|---|---|---|---|---|---|---|---|---|
| 412 ECS | H | H | L | H | L | H | H | L | L | V | L | H | H | H |

FIG. 4A

MODE REGISTER (MRx) 420

| | ADDRESS | OPERATING MODE | DESCRIPTION |
|---|---|---|---|
| 424 | Az | ERROR CHECK AND SCRUB (ECS) | 0=EXIT ECS MODE<br>1=PERFORM ECC OPERATIONS AND COUNT ERRORS |
| 422 | Ay | ECS RESET | 0=INITIALIZE ERROR COUNT REGISTERS<br>1=CLEAR ERROR COUNT REGISTERS |

FIG. 4B

MPR PAGE 430 (ADDRESS OF ROW WITH MAX ERRORS)

| ADDRESS | MPR LOCATION | [7] | [6] | [5] | [4] | [3] | [2] | [1] | [0] |
|---|---|---|---|---|---|---|---|---|---|
| BA1:BA0 | 00 = MPR0 | A[7] | A[6] | A[5] | A[4] | A[3] | A[2] | A[1] | A[0] |
| | 01 = MPR1 | A[15] | A[14] | A[13] | A[12] | A[11] | A[10] | A[9] | A[8] |
| | 10 = MPR2 | EC[5] | BG[1] | BG[0] | BA[2] | BA[1] | BA[0] | A[17] | A[16] |
| | 11 = MPR3 | EC[4] | EC[3] | EC[2] | EC[1] | EC[0] | C[2] | C[1] | C[0] |

FIG. 4C

MPR PAGE 440 (ROWS WITH ERRORS)

| ADDRESS | MPR LOCATION | [7] | [6] | [5] | [4] | [3] | [2] | [1] | [0] |
|---|---|---|---|---|---|---|---|---|---|
| BA1:BA0 | 00 = MPR0 | EC[7] | EC[6] | EC[5] | EC[4] | EC[3] | EC[2] | EC[1] | EC[0] |
| | 01 = MPR1 | EC[15] | EC[14] | EC[13] | EC[12] | EC[11] | EC[10] | EC[9] | EC[8] |
| | 10 = MPR2 | RFU | RFU | RFU | RFU | EC[19] | EC[18] | EC[17] | EC[16] |
| | 11 = MPR3 | RFU | RFU | RFU | RFU | RFU | RFU | RFU | RFU |

FIG. 4D

MEMORY DEVICE ERROR CHECK AND SCRUB MODE AND ERROR TRANSPARENCY

RELATED APPLICATIONS

This patent application is a nonprovisional application based on U.S. Provisional Application No. 62/211,448, filed Aug. 28, 2015. This application claims the benefit of priority of that provisional application. The provisional application is hereby incorporated by reference.

The present patent application is related to the following two patent applications, which also claim priority to the same U.S. Provisional Application identified above: patent application Ser. No. 14/998,059, entitled "MEMORY DEVICE CHECK BIT READ MODE"; and, patent application Ser. No. 14/998,142, entitled "MEMORY DEVICE ON-DIE ECC (ERROR CHECKING AND CORRECTING) CODE"; both filed concurrently herewith.

FIELD

The descriptions are generally related to memory management, and more particular descriptions are related to error checking and correction in a memory subsystem with a memory device that performs internal error checking and correction.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Intel Corporation, All Rights Reserved.

BACKGROUND

Volatile memory resources find widespread usage in current computing platforms, whether for servers, desktop or laptop computers, mobile devices, and consumer and business electronics. DRAM (dynamic random access memory) devices are the most common types of memory devices in use. DRAM errors are projected to increase as the manufacturing processes to produce the DRAMs continue to scale to smaller geometries. One technique for addressing the increasing DRAM errors is to employ on-die ECC (error checking and correction). On-die ECC refers to error detection and correction logic that resides on the memory device itself. With on-die ECC logic, a DRAM can correct single bit failures, such as through a single error correction (SEC). On-die ECC can be used in addition to system level ECC, but the system level ECC has no insight into what error correction has been performed at the memory device level. Thus, while on-die ECC can handle errors inside a memory device, errors can accumulate undetected by the host system.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4A is a block diagram of an embodiment of command encoding that enables an error check and scrub (ECS) mode.

FIG. 4B is a block diagram of an embodiment of a mode register that enables an error check and scrub (ECS) mode.

FIG. 4C is a block diagram of an embodiment of a multipurpose register to store an address of a row with a maximum error count.

FIG. 4D is a block diagram of an embodiment of a multipurpose register to store a count of a number of rows containing an error.

Figure 1:
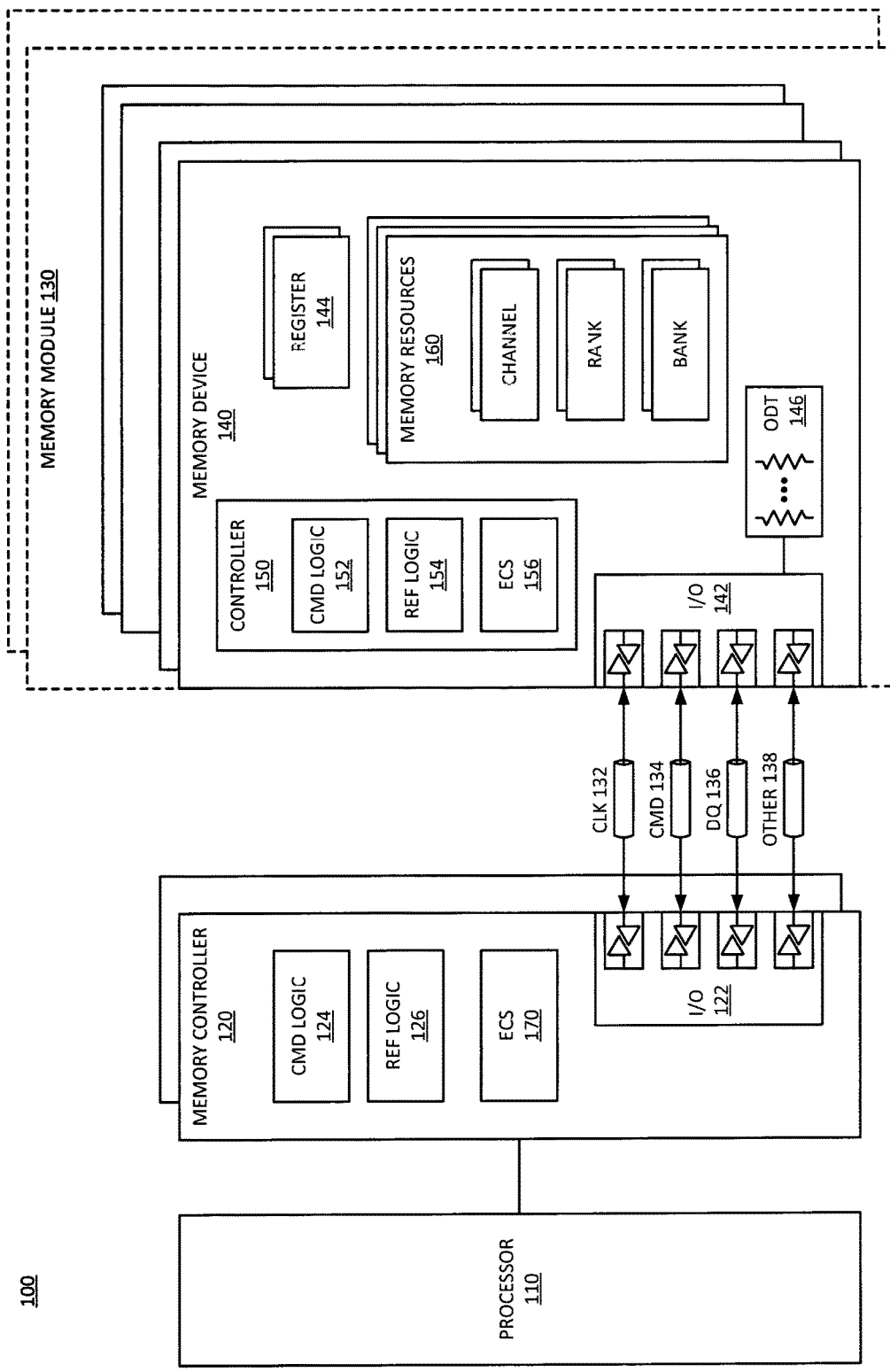
FIG. 1 is a block diagram of an embodiment of a system in which a memory device monitors errors with an error check mode.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory device mode enables error monitoring. The error monitoring mode can be referred to by any label. An error monitoring mode as described herein enables the performing of error checking and correction (ECC) and the counting of a total number of memory segments having errors as well as a segment having the highest number of errors. Typically a segment or portion would be a row of the memory device, where each data chunk within the row (e.g., a prefetch size of data) can be tested for an error. ECC refers herein to any process and/or operation or group of operations to check the validity of stored data based on error checking and correction data, and to perform some form of error correction routine based on the operation or process.

In one embodiment, the error monitoring mode is an error check and scrub (ECS) mode to enable a DRAM (dynamic random access memory device) to perform one or more ECC operations, and count errors. Again, such error monitoring mode can be referred to by any name, but ECS mode is used herein for simplicity by way of example, and is not limiting. A memory controller associated with the memory device triggers the ECS mode with a trigger sent to the memory device. Thus, the host can control the mode and receive error count information. The memory device includes multiple addressable memory locations, which can be organized in segments such as wordlines or rows or other portions. The memory locations store data and have associated ECC information. In the ECS mode, the memory device reads one or more memory locations and performs ECC for one or more memory locations based on ECC information stored within the memory device. Thus, the memory device performs internal ECC in the ECS mode. The memory device counts error information including a segment count indicating a number of segments having at least a threshold number of errors, and a maximum count indicating a maximum number of errors in any segment.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

Whereas in traditional memory subsystems errors can accumulate undetected within a DRAM because of on-die or internal ECC, as described herein a memory device can count errors and expose the error information to a host system. On-die or internal ECC within a memory device typically refers to error checking and correction of single bit errors (SBEs) in the memory array. In one embodiment, a DRAM compatible with DDR4E or a variant or extension can apply ECS combined with error counting or monitoring. Thus, one embodiment of a DDR4E DRAM can scrub errors and track the error accumulation of the device. In one embodiment, using ECS, a memory device keeps an error count indicating a number of rows that have at least one error, and tracks a row address having the highest number of errors.

In one embodiment, DDR4E devices incorporate on-die ECC and include rows or wordlines having multiple addressable locations of 128-bit data chunks. The data chunks can have associated ECC bits (e.g., 8 bits of internal error correction data). ECS mode can provide transparency support for such DDR4E devices. In one embodiment, ECS mode includes an error check and scrub operation that incorporates an error count mechanism as part of the ECC operation. ECS mode can enable a DRAM to internally read, correct SBEs, and write back corrected data to the array. Such reading, correcting, and writing back can be referred to as "scrubbing" errors.

In one embodiment, a memory device that supports ECS mode includes one or more registers to store error count information. For example, the registers can be DRAM Mode Registers. The register locations can include multipurpose registers (MPRs) where the memory device can store error count information including a number of segments having errors, and a maximum count of errors and/or an address of a segment having a maximum error count. In one embodiment, a memory device uses two registers in ECS mode to track code word and check bit errors detected during the ECS mode operation. In one embodiment, the memory device stores a value from a Row Error Counter to one register, and stores a value from an Errors per Row Counter to another register. In one embodiment, a row error counter tracks the number of rows that have at least a threshold number of code word and check bit errors detected. The threshold number can be one error. The threshold number can be two errors or some other number of errors. In one embodiment, the errors per row counter tracks the address of the row with the largest number of code word and check bit errors, and can include the code word and check bit error count for that row.

In one embodiment, the memory controller reads the error count information stored by the memory device in the registers. The host system (e.g., the host operating system and/or the host CPU (central processing unit)) can utilize the error count information to improve system-level RAS (reliability, accessibility, and serviceability) of the memory subsystem. Thus, by the memory subsystem providing transparency into the error count information on the memory devices, the memory devices themselves do not need to expose specific error information, but can provide enough information to improve error correction at the system level. In one embodiment, a memory controller can extract multibit error information from the error information, and apply the multibit information to determine how to apply ECC to the system (e.g., by knowing where errors occurred in the memory). In one embodiment, the memory controller uses the error information from the memory device as metadata for improving SDDC (single device data correction) ECC operations targeting multibit errors.

FIG. 1 is a block diagram of an embodiment of a system in which a memory device monitors errors with an error check mode. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single and/or a multicore processing unit. The processing unit can be a primary processor such as a CPU (central processing unit) and/or a peripheral processor such as a GPU (graphics processing unit). System 100 can be implemented as an SOC, or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAMs in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. In one embodiment, settings for each channel are controlled by separate mode register or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus. I/O interface logic 122 (as well as I/O 142 of memory device 140) can include pins, connectors, signal lines, and/or other hardware to connect the devices. I/O interface logic 122 can include a hardware interface. As illustrated, I/O interface logic 122 includes at least drivers/transceivers for signal lines. Typically, wires within an integrated circuit interface with a pad or connector to interface to signal lines or traces between devices. I/O interface logic 122 can include drivers, receivers, transceivers, termination, and/or other circuitry to send and/or receive signal on the signal lines between the devices. The system bus can be implemented as multiple signal lines coupling memory controller 120 to memory devices 140. The system bus includes at least clock (CLK) 132, command/address (CMD) 134, data (DQ) 136, and other signal lines 138. The signal lines for CMD 134 can be referred to as a "C/A bus" (or ADD/CMD bus, or some other designation indicating the transfer of commands and address information) and the signal lines for DQ 136 be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

It will be understood that the system bus includes a data bus (DQ 136) configured to operate at a bandwidth. Based on design and/or implementation of system 100, DQ 136 can have more or less bandwidth per memory device 140. For example, DQ 136 can support memory devices that have either a x32 interface, a x16 interface, a x8 interface, or other interface. The convention "xN," where N is a binary integer refers to an interface size of memory device 140, which represents a number of signal lines DQ 136 that exchange data with memory controller 120. The interface size of the memory devices is a controlling factor on how many memory devices can be used concurrently per channel in system 100 or coupled in parallel to the same signal lines.

Memory devices 140 represent memory resources for system 100. In one embodiment, each memory device 140 is a separate memory die, which can include multiple (e.g., 2) channels per die. Each memory device 140 includes I/O interface logic 142, which has a bandwidth determined by the implementation of the device (e.g., x16 or x8 or some other interface bandwidth), and enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically memory resources 160 are managed as rows of data, accessed via cacheline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry for the sub-banks.

In one embodiment, memory devices 140 include one or more registers 144. Registers 144 represent storage devices or storage locations that provide configuration or settings for the operation of the memory device. In one embodiment, registers 144 can provide a storage location for memory device 140 to store data for access by memory controller 120 as part of a control or management operation. In one embodiment, registers 144 include Mode Registers. In one embodiment, registers 144 include multipurpose registers. The configuration of locations within register 144 can configure memory device 140 to operate in different "mode," where command and/or address information or signal lines can trigger different operations within memory device 140 depending on the mode. Settings of register 144 can indicate configuration for I/O settings (e.g., timing, termination or ODT (on-die termination), driver configuration, and/or other I/O settings.

In one embodiment, memory device 140 includes ODT 146 as part of the interface hardware associated with I/O 142. ODT 146 can be configured as mentioned above, and provide settings for impedance to be applied to the interface to specified signal lines. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller. Controller 150 can determine what mode is selected based on register 144, and configure the access and/or execution of operations for memory resources 160 based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 of memory device 140 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications.

In one embodiment, memory controller 120 includes refresh (REF) logic 126. Refresh logic 126 can be used where memory devices 140 are volatile and need to be refreshed to retain a deterministic state. In one embodiment, refresh logic 126 indicates a location for refresh, and a type of refresh to perform. Refresh logic 126 can trigger self-refresh within memory device 140, and/or execute external refreshes by sending refresh commands. For example, in one embodiment, system 100 supports all bank refreshes as well as per bank refreshes, or other all bank and per bank commands. All bank commands cause an operation of a selected bank within all memory devices 140 coupled in parallel. Per bank commands cause the operation of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In one embodiment, memory controller 120 includes error correction and control logic to perform system-level ECC for system 100. System-level ECC refers to application of error correction at memory controller 120, and can apply error correction to data bits from multiple different memory devices 140. In one embodiment, memory controller 120 includes ECS 170, which represents circuitry or logic to enable an ECS mode in one or more memory devices 140. In one embodiment, ECS 170 includes logic to set a mode register 144 of memory device 140 to trigger ECS mode. In one embodiment, ECS 170 includes logic to encode and send a command to trigger the ECS mode in one or more memory devices 140. In one embodiment, ECS 170 includes logic to read error information from memory device 140.

In one embodiment, controller 150 includes ECS logic 156, which represents logic in memory device 140 to enter ECS mode and perform one or more ECS operations. ECS logic 156 can be considered to include internal or on-die ECC logic to perform ECC operations. In one embodiment, ECS 156 reads a setting of register 144 to determine if ECS mode is enabled. In one embodiment, ECS 156 determines an ECS mode trigger is received via command logic decoding of logic 152. In one embodiment, ECS 170 of memory controller 120 sets one or more bits of register 144 to reset error information counts.

Typically, a DRAM has an on-die or internal oscillator (not specifically shown) to control the timing of internal operations. For a small number of operations, the difference in timing between an internal oscillator and system timing controlled by the host can be synchronized fairly easily. For a longer series of instructions, the timing drift between memory device 140 and the host can create synchronization issues. In one embodiment, memory controller 120 issues a series of ECS operation commands for memory device 140 to execute in ECS mode. In one embodiment, memory controller 120 simply puts memory device 140 into ECS mode and allows controller 150 to control the operations internally. In the case of a series of external operations from memory controller 120, controller 150 can generate internal commands from the external commands to sequence through the memory locations of memory resources 160 to perform ECC. In the case of the memory controller placing memory device 140 in ECS mode, controller 150 can generate the internal commands to sequence through the memory resources. In one embodiment, in either case controller 150 controls at least a portion of the generation of memory location addresses for the ECS operations.

Figure 2:
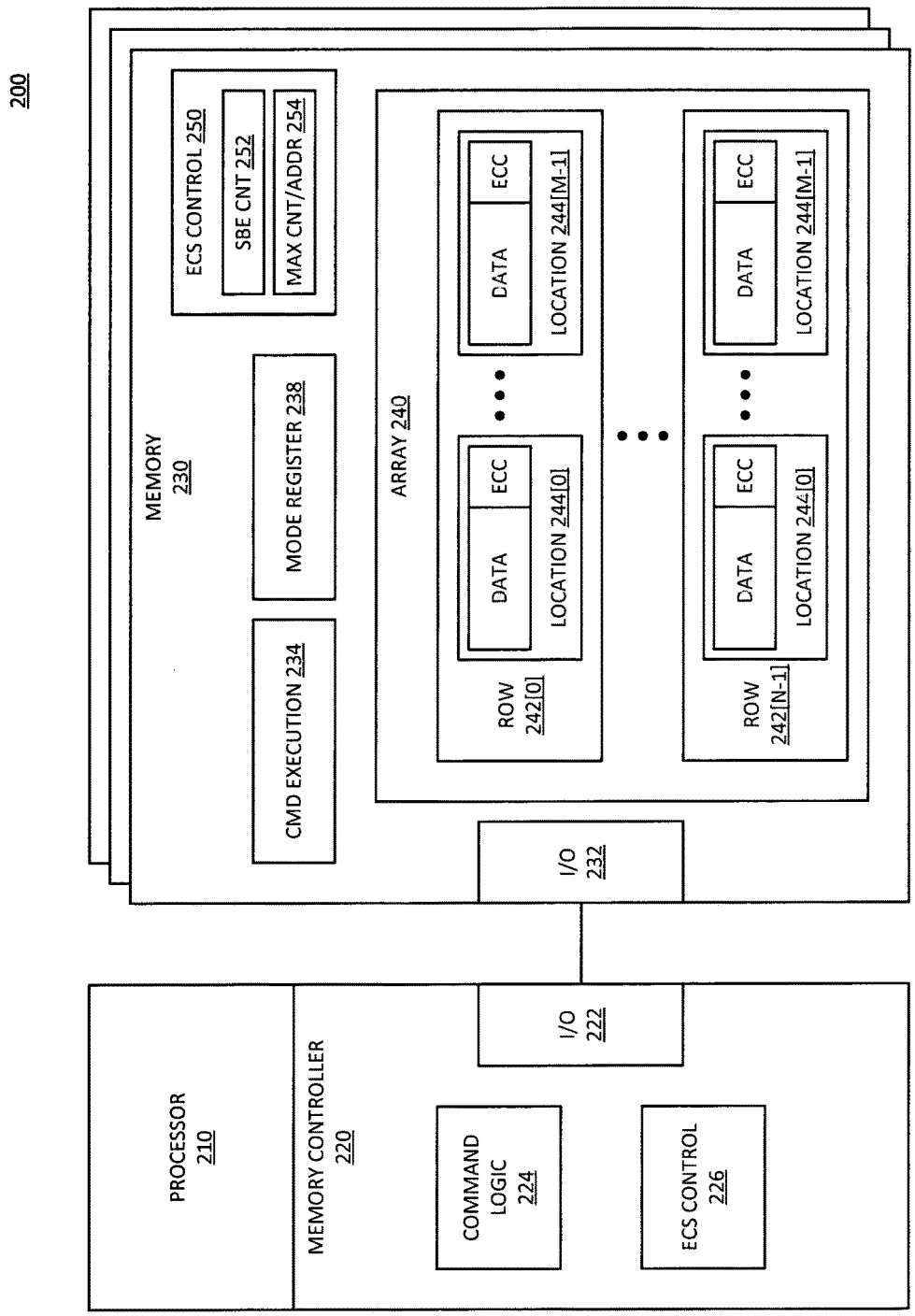
FIG. 2 is a block diagram of an embodiment of a system that performs internal error correction and stores error information.

FIG. 2 is a block diagram of an embodiment of a system that performs internal error correction and stores error information. System 200 represents components of a memory subsystem. System 200 provides one example of a memory subsystem in accordance with an embodiment of system 100 of FIG. 1. System 200 can be included in any type of computing device or electronic circuit that uses memory with internal ECC, where the memory devices count error information. Processor 210 represents any type of processing logic or component that executes operations based on data stored in memory 230 or to store in memory 230. Processor 210 can be or include a host processor, central processing unit (CPU), microcontroller or microprocessor, graphics processor, peripheral processor, application specific processor, or other processor. Processor 210 can be or include a single core or multicore circuit.

Memory controller 220 represents logic to interface with memory 230 and manage access to data of memory 230. As with the memory controller above, memory controller 220 can be separate from or part of processor 210. Processor 210 and memory controller 220 together can be considered a "host" from the perspective of memory 230, and memory 230 stores data for the host. In one embodiment, memory 230 includes DDR4E DRAMs that have internal ECC (which may be referred to in the industry as DDR4E). In one embodiment, system 200 includes multiple memory resources 230. Memory 230 can be implemented in system 200 in any type of architecture that supports access via memory controller 220 with use of internal ECC in the memory. Memory controller 220 includes I/O (input/output) 222, which includes hardware resources to interconnect with corresponding I/O 232 of memory 230.

Memory 230 includes command execution 234, which represents control logic within the memory device to receive and execute commands from memory controller 220. The commands can include a series of ECC operations for the memory device to perform in ECS mode to record error count information. In one embodiment, mode register 238 includes one or more multipurpose registers to store error count information. In one embodiment, mode register 238 includes one or more fields that can be set by memory controller 220 to enable the resetting of the error count information.

Memory 230 includes array 240, which represents the array of memory locations where data is stored in the memory device. In one embodiment, each address location 244 of array 240 includes associated data and ECC bits. In one embodiment, address locations 244 represent addressable chunks of data, such as 128-bit chunks, 64-bit chunks, or 256-bit chunks. In one embodiment, address locations 244 are organized as segments or groups of memory locations. For example, as illustrated, memory 230 includes multiple rows 242. In one embodiment, each row 242 is a segment or a portion of memory that is checked for errors. In one embodiment, rows 242 correspond to memory pages or wordlines. Array 240 includes N rows 242, and rows 242 include M memory locations.

In one embodiment, address locations 244 correspond to memory words, and rows 242 correspond to memory pages. A page of memory refers to a granular amount of memory space allocated for a memory access operation. In one embodiment, array 240 has a larger page size to accommodate the ECC bits in addition to the data bits. Thus, a normal page size would include enough space allocated for the data bits, and array 240 allocates enough space for the data bits plus the ECC bits.

In one embodiment, memory controller includes ECS control 226 to manage an ECS mode for ECC operation and error counting in memory 230. In one embodiment, memory 230 includes internal ECC managed by ECS control 250. Memory controller 220 manages system wide ECC, and can detect and correct errors across multiple different memory resources in parallel (e.g., multiple memory resources 230). Many techniques for system wide ECC are known, and can include managing memory resources in a way to spread errors across multiple parallel resources. By spreading errors across multiple resources, memory controller 220 can recover data even in the event of one or more failures in memory 230. Memory failures are generally categorized as either soft errors or soft failures, which are transient bit errors typically resulting from random environmental conditions, or hard errors or hard failures, which are non-transient bit errors occurring as a result of a hardware failure.

In one embodiment, ECS control 250 includes a count 252 of rows 242 that include an SBE. In one embodiment, ECS control 250 includes one or more counters. For example, SBE count 252 can be one of the counters. ECS control 250 includes ECC logic (not specifically shown) to perform error checking and correction. When an error is detected in a row 242, ECS control 250 increments SBE count 252. In one embodiment, ECS control 250 includes max count and/or max address 254. In one embodiment, the max count can be kept in another counter. In one embodiment, the max address refers to an address of the segment or row 242 determined to have the highest number of errors.

In one embodiment, memory 230 is part of a rank of memory resources. In one embodiment, memory includes multiple banks of memory resources, and each bank can be separately accessed. In one embodiment, all banks must be precharged and in the idle state prior to enabling ECS mode. In one embodiment, command execution 234 identifies a specific command sequence for ECS mode. In one embodiment, only a specific command sequence is permitted in ECS mode. While different implementations can vary, one example of an allowed command sequence could be as follows: ECS→DES→ACT→DES→WR→DES→PRE-→DES. It will be understood that a NOP could be used in place of the deselect commands (DES), but a NOP command may require toggling a chip select (CS) bit and require the memory to decode the command, whereas a DES command allows the memory to simply remain idle for the cycle.

The command sequence can be described as an ECS command trigger, which may not be necessary if ECS mode is triggered via a mode register setting, followed by a Deselect (DES), an Activate (ACT), another DES, a Write (WR), another DES, a Precharge (PRE), and another DES. In one embodiment, the ECS command places memory 230 in ECS mode. In one embodiment, the ECS command is to be followed by an ACT command tMOD later; the ACT command is to be followed by a WR command tRCD later; and, the WR command is to be followed by a PRE command WL+tWR+10 CKs later, provided tECSc is satisfied. In one embodiment, the minimum time for the ECS Mode period is tECSc (which can be the larger of 45 CKs or 110 ns). It will be understood that tMOD can refer to a timing delay for a mode register set command update, tRCD can refer to a timing delay from an ACT command to an internal read or write, WL can refer to a write latency, tWR can refer to a write recovery time, and CK can refer to a clock cycle.

In one embodiment, memory 230 ignores data I/O and address inputs of I/O 232 while in ECS mode, for a period of tMOD after an ECS command is issued. Ignoring the address inputs can include ignoring bank address (BA) values and bank group (BG) values. In one embodiment, I/O control for I/O 232 sets the data I/O and address inputs into a tri-state operation.

In one embodiment, for an ECS→ACT→WR sequence (ignoring intervening DES commands), the ECS command will enable the ECS mode, and the ACT command will internally perform a row activation. The row activation can occur for a row determined by an internal ECS Address Counter within ECS control 250 (not specifically shown). In one embodiment, the WR command will perform an internal Read Modify Write cycle for the activated row, with a column address determined by an internal ECS Address Counter within ECS control 250. It will be understood that ECS control 250 can be part of an internal controller (such as controller 150 of system 100). Thus, counters and control within ECS control 250 can be part of logic within an internal controller. Alternatively, separate ECS control logic such as a separate logic circuit or microcontroller to implement the ECS operations.

In one embodiment, the internal Read and Write cycle or Read Modify Write cycle reads the entire code word and check bits from array 240 (e.g., 128 data bits and 8 check bits), corrects an SBE in the code word or check bits, and writes the resultant code word and check bits back to the appropriate row 242 in array 240. In one embodiment, a PRE command exits the ECS mode and returns memory 230 to normal mode.

As referred to above, in one embodiment, ECS control 250 includes logic to internally generate address information for performing ECS operations. In one embodiment, an ECS mode sequences through an entire memory area, such as a bank group. In one embodiment, ECS control 250 keeps track of the addresses for sequencing through memory 230. In one embodiment, memory controller 220 keeps track of certain address information and memory 230 keeps track of other address information. For example, consider an implementation where memory controller 220 identifies a bank group and memory 230 keeps track of row addresses and column addresses within the bank group. Alternatively, consider that memory controller 220 identifies a bank group and column, and memory 230 identifies the row. Many other implementations are possible. The implementation will depend on the system design, such as whether the address locations are swizzled on memory 230 and the memory controller cannot effectively sequentially run through the check space. In one embodiment, the memory controller is responsible to provide enough ECC operation commands, and the memory device performs all addressing internally. In one embodiment, one ECS command causes an ECC operation on a single memory location, and the memory controller sends a sequence of ECS commands to perform ECC operations on many locations.

Regardless of whether memory 230 or memory controller 220 identify the addressing, and regardless of whether an ECS command triggers an ECC operation on one or multiple memory locations, memory 230 counts the number of errors during the ECS mode operations. As described, the error count information can include the total number of rows or other segments that have errors, and the highest error count for any segment.

Figure 3:
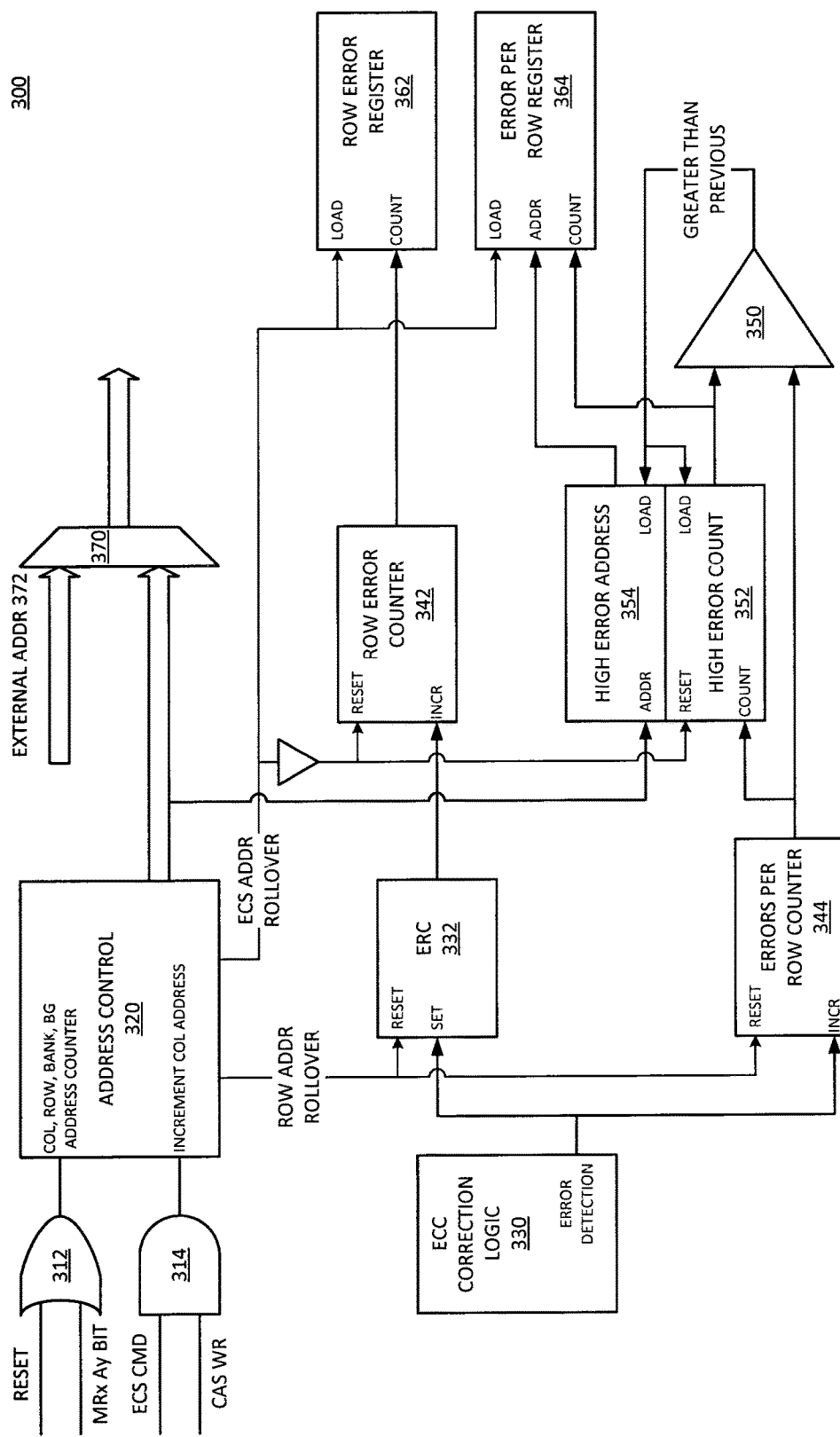
FIG. 3 is a block diagram of an embodiment of a system in which a register stores a number of rows with errors, and a maximum error for any row.

FIG. 3 is a block diagram of an embodiment of a system in which a register stores a number of rows with errors, and a maximum error for any row. System 300 illustrates components of an ECC system that keeps counts of error information, and implements an example of ECS in accordance with an embodiment of system 100 of FIG. 1 and/or system 200 of FIG. 2. System 300 provides a representation of components to perform ECS mode operations. In one embodiment, the registers that store the end count are registers accessible to the host, and other components are within a controller on the memory device.

Address control 320 represents control logic to enable a memory device to manage internal addressing for ECS operations. As previously described, the memory device may be responsible for certain address information and the memory controller responsible for other address information. Thus, system 300 can have different implementations depending on the address information responsibility of the memory device. In one embodiment, address control 320 includes one or more ECS address counters to increment addresses for ECS commands. Address control 320 can include counters for column addresses, row addresses, bank addresses, bank group addresses, and/or a combination of these. In one embodiment, address control 320 includes a counter to increment the column address for a row or other segment for an ECS operation.

In one embodiment, address control 320 increments the column address on each ECS WR command, which can be triggered or indicated by ANDing an internal ECS command signal (ECS CMD) with an internal write command as indicated by an internal column address strobe for a write (CAS WR), as illustrated with logic 314. The internal signals refer to signal generated internally within a memory device by an internal controller, rather than specifying a command received from an external memory controller. The internal commands are generated in response to external commands from the host. In one embodiment, once the column counter wraps or rolls over, the row counter will sequentially increment and read each code word and associated check bits in the next row until all of the rows within a bank are accessed. In one embodiment, once the row counter wraps, the bank counter will sequentially increment and the next sequential bank within a bank group will repeat the process of accessing each code word and associated check bits until all banks and bank groups within the memory are accessed.

In one embodiment, column, row, bank, bank group, and/or other counter to generate internal addresses in address control 320 can be reset in response to a RESET condition for the memory subsystem and/or in response to a bit in a mode register (MRx Ay bit), as illustrated with logic 312. A reset can occur on a power cycle or other system restart. In one embodiment, the address information generated by address control 320 can be used to control decode logic (e.g., row and column decoder circuits within the memory device) to trigger the ECS operations. However, seeing that for other operations the memory device operates on external address information received from the host, in one embodiment, system 300 includes multiplexer 370 to select between external address 372 and internal address information from address control 320. While not specifically shown, it will be understood that the control for mux 370 can be the ECS mode state, where in ECS mode the internal address generation is selected to access a memory location of the memory array, and when not in ECS mode external address 372 is selected to access the memory location of the memory array.

When the memory controller provides some address information, the selection logic of system 300 can be selectively more complex. Based on internal address information and/or external address information, system 300 can check all code words and check bits within the memory. More specifically, system 300 can perform ECS operations, which include ECC operations to read, correct, and write memory locations for all selected or specified addresses. After being operated on once, system 300 can be configured (e.g., via the size of the counters) to wrap the counters and restart the address count. For example, once all memory locations for a memory have been checked, a bank group counter can wrap and begin the process again with the next ECS command. The total number of ECS commands required to complete one cycle of ECS mode is density dependent. Table 1 provides one example of a listing of the number of commands required based on the number of code words for various memory configurations. In one embodiment, a DRAM controller keeps track of the number of ECS commands issued to the DRAM to error check all of the code words and check bits in the device.

TABLE 1

| Number of Code Words per Bank Group (for 128 bit CW) | | | | | | | | |
|---|---|---|---|---|---|---|---|---|
| 8 Gb × 4 | 8 Gb × 8 | 8 Gb × 16 | 12 Gb × 4 | 12 Gb × 8 | 12 Gb × 16 | 16 Gb × 4 | 16 Gb × 8 | 16 Gb × 16 |
| CW per die | 67,108,864 | | | 100,663,296 | | | 134,217,728 | |

For 8 Gb devices having x4, x8, or x16 interfaces, the number of 128-bit codes words is 67,108,864, which would require an equal number of commands to cycle through all memory locations. For 12 Gb devices having x4, x8, or x16 interfaces, the number of 128-bit codes words is 100,663,296. For 16 Gb devices having x4, x8, or x16 interfaces, the number of 128-bit codes words is 134,217,728.

System 300 includes ECC correction logic 330 to perform error checking and correction operations on selected or addressed memory location(s). In one embodiment, logic 330 generates an output flag when an error is detected in a memory location. Logic 330 can generate the flag in response to detecting and correcting a single bit error (SBE) with ECC operations. In one embodiment, the error detection signal from logic 330 triggers ERC (error row counter) 332 and errors per row counter 344 to increment. In one embodiment, ERC 332 has a threshold number of memory locations that must trigger as having errors in a particular row or segment before counting the row as a row having errors (identified in some places as threshold N). For example, the threshold could be 1 error, and all rows having at least one error are counted. As another example, the threshold could be 2 errors, and a row with only one error will not be counted, but all rows having at least 2 errors are counted. It will be understood that the threshold can be set based on system configuration considerations. Thus, the definition of what a "bad row" is can be set by the threshold for ERC 332. If the number of errors is one, ERC 332 may be unnecessary, and the output of ECC logic 330 can be fed directly into row error counter 342.

As illustrated, when the threshold number of errors per row has been reached as determined by ERC 332, ERC 332 outputs a signal to cause row error counter 342 to increment its count. Every error detected by logic 330 causes errors per row counter 344 to increment. It will be understood that ERC 332 and errors per row counter 344 generate information on a per-row or per-segment basis; thus, when the row address rolls over, address control 320 can trigger ERC 332 and error per row counter 344 to reset their counts.

Thus, in one embodiment, errors per row counter 344 increments each time a code word or a check bit error is detected and is reset each time the row counter wraps or rolls over. In one embodiment, if one or more code word or check bit errors are detected during ECS WR commands on a given row, row error counter 342 increments by one. In one embodiment, row error counter 342 increments by one for each two errors (or other number of errors configured) detected in a row.

Errors per row counter 344 tracks the total number of code words or check bit errors on a given row. In one embodiment, counter 344 provides its count for comparison to a previous high or maximum error count. High error count 352 represents a register or other storage that holds a high error count indicating the maximum number of errors detected in any of the rows. Comparison logic 350 determines if the count value in errors per row counter 344 is greater than high error count 352. In one embodiment, if the current error count in counter 344 is greater than the previous maximum of high error count 352, logic 350 generates an output that triggers high error address 354 to be set to the address of the current row. Additionally, high error count 352 is set to the count from errors per row counter 344. In one embodiment, the row code word or check bit error count is compared to the previous row code word or check bit error count to determine the row address with the highest error count within the DRAM.

In one embodiment, after perform ECS operations for all rows in the memory space identified for checking, address control 320 triggers a signal indicating that the last address has been reached or rolled over. In one embodiment, the signal triggers row error register 362 to load the count from row error counter 342, and row error counter 342 is reset. In one embodiment, system 300 includes a delay in propagating the signal to guarantee that register 362 latches the count from counter 342 prior to the counter being reset. In one embodiment, the signal indicating the last address has been reached also triggers error per row register 364 to load the count from high error count 352. In one embodiment, the signal indicating the last address has been reached also triggers error per row register 364 to load the address from high error address 354. In one embodiment, the signal for register 364 to load the address and/or count also triggers high error count 352 to reset. In one embodiment, row error register 362 represents MPR PAGE 5 of a mode register of a DRAM. In one embodiment, row error register 364 represents MPR PAGE 4 of a mode register of a DRAM.

FIG. 4A is a block diagram of an embodiment of command encoding that enables an error check and scrub (ECS) mode. Command encoding 410 represents an example of ECS command encoding in accordance with any embodiment of ECS that triggers an ECS mode with command encoding. ECS command 412 illustrates one example of encoding, where the clock enable bits are set high, as well as ACT_n, CAS_n, and WE_n. Chip select CS_n is set low along with RAS_n. In one embodiment, the bank address information (BA and BG) are set low, and the row address bits A11:A0 are held high. In one embodiment, A12 is set low. In such an encoding, the DRAM will internally generate the addresses for ECS operations. Alternatively, command 412 can include certain address information.

FIG. 4B is a block diagram of an embodiment of a mode register that enables an error check and scrub (ECS) mode. Mode register 420 represents an example of a mode register in a DRAM that supports an ECS mode. In one embodiment, what is illustrated as mode register 420 can be two separate mode registers. As illustrated, address 424 (Az) represents a bit that triggers ECS mode, in accordance with any embodiment of ECS that triggers an ECS mode with a mode register. Address 422 (Ay) represents a bit that triggers ECS counter reset. In an implementation where command encoding triggers ECS mode, address 424 may not be used, while address 422 could still provide the ability to reset ECS counters. In one embodiment, a '1' written to address 424 can trigger ECS mode to cause a memory device to perform ECC operations and count errors, while a '0' can exit ECS mode.

In one embodiment, an ECS mode requires two additional mode register bits. A first bit is address 422, which enables the clearing of counters and error result registers. The encoding could be reversed, but as illustrated, a '1' can clear the counters and result registers, and a '0' can initialize the registers and counters. In one embodiment, Ay must be written to before a subsequent 1 can be applied to clear the counters and registers. A second bit is not specifically illustrated, and is a mode register bit to enable the result registers. For example, in one embodiment, the mode register bit enables MPR Pages 4 to 7, where results are stored in MPR 4 and 5 (Pages 4 and 5).

FIG. 4C is a block diagram of an embodiment of a multipurpose register to store an address of a row with a maximum error count. MPR page 430 represents a register that stores an address of a row with a maximum number of errors. For example, MPR page 430 can be MPR page 4 in a DDR4E implementation. In one embodiment, address BALBA0 provides an MPR location. For example, '00' can correspond to MPR0, '01' can correspond to MPR1, '10' can correspond to MPR2, and '11' can correspond to MPR3. In one embodiment, the bits of MPR page 430 are allocated as: A[17:0] is the Row Address, BA[1:0] is the Bank Address, BG[2:0] is the Bank Group Address, and EC[5:0] are the number of code word and check bit errors, limited to a maximum of 64 errors ($2^5$). In one embodiment, only a first row having the bit-maximum number of errors will be recorded in MPR page 430, and if any other rows also have the maximum number of errors, they will not be specifically identified by address.

In one embodiment, MPR page 430 stores the information for access by the host. In one embodiment, MPR page 430 is not automatically cleared after being read by the host, and should be read by the host each time a complete sequence of ECS commands is performed. In one embodiment, the host resets the register is reset to zeros by the host prior to a subsequent sequencing through the DRAM.

FIG. 4D is a block diagram of an embodiment of a multipurpose register to store a count of a number of rows containing an error. MPR page 440 represents a register that stores an address of a row with a maximum number of errors. For example, MPR page 440 can be MPR page 5 in a DDR4E implementation. In one embodiment, address BA1:BA0 provides an MPR location. For example, '00' can correspond to MPR0, '01' can correspond to MPR1, '10' can correspond to MPR2, and '11' can correspond to MPR3. In one embodiment, the bits of MPR page 450 are allocated as: EC[N−1:0] is the number of rows with at least a threshold (e.g., at least 1 or at least 2) code word or check bit errors, up to a maximum of $2^{N-1}$ rows. In one embodiment, N=16 for a maximum of 65,536 rows. As illustrated, N=20. Locations marked RFU can be reserved for future use.

In one embodiment, MPR page 440 stores the information for access by the host. In one embodiment, MPR page 440 is not automatically cleared after being read by the host, and should be read by the host each time a complete sequence of ECS commands is performed. In one embodiment, the host resets the register is reset to zeros by the host prior to a subsequent sequencing through the DRAM.

Figure 5:
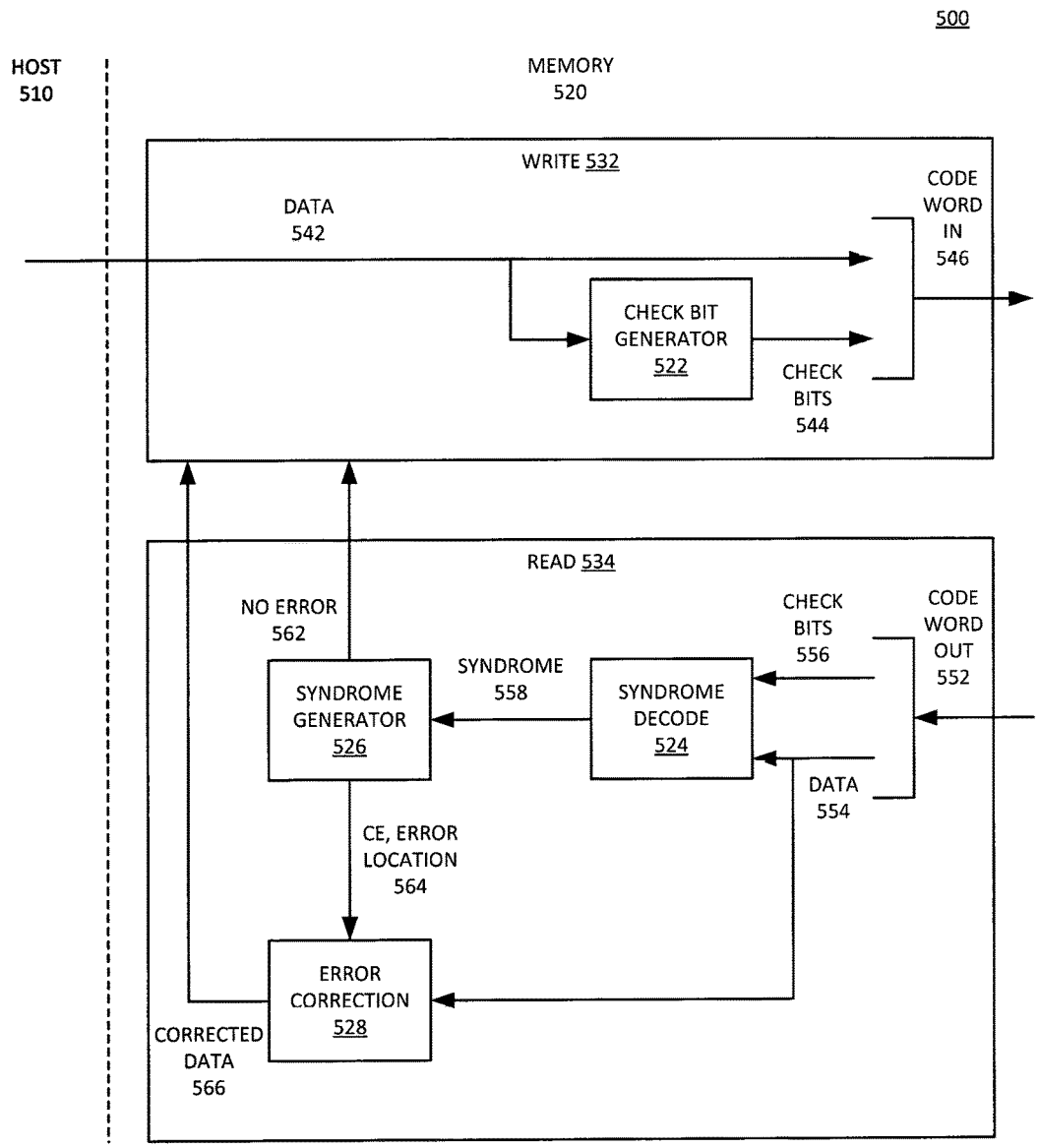
FIG. 5 is a block diagram of an embodiment of logic at a memory device that generates error correction information and supports an error check and scrub mode.

FIG. 5 is a block diagram of an embodiment of logic at a memory device that generates error correction information and supports an error check and scrub mode. System 500 is one example of ECC component operation for a memory subsystem with a memory device having internal ECC that supports an ECS mode to count error information, in accordance with an embodiment described herein. System 500 provides an example of internal ECC in a DRAM, which generates and stores internal check bits. Host 510 includes a memory controller or equivalent or alternative circuit or component that manages access to memory 520. Host 510 performs external ECC on data read from memory 520.

System 500 illustrates write path 532 in memory 520, which represents a path for data written from host 510 to memory 520. Host 510 provides data 542 to memory 520 for writing to the memory array(s). In one embodiment, memory 520 generates check bits 544 with check bit generator 522 to store with the data in memory, which can be one example of internal ECC bits used for code word checking/correction. Check bits 544 can enable memory 520 to correct an error that might occur in the writing to and reading from the memory array(s). Data 542 and check bits 544 can be included as code word in 546, which is written to the memory resources. It will be understood that check bits 544 represent internal check bits within the memory device. In one embodiment, there is no write path to check bits 544.

Read path 534 represents a path for data read from memory 520 to host 510. In one embodiment, at least certain hardware components of write path 532 and read path 534 are the same hardware. In one embodiment, memory 520 fetches code word out 552 in response to a Read command from host 510. The code word can include data 554 and check bits 556. Data 554 and check bits 556 can correspond, respectively, to data 542 and check bits 544 written in write path 532, if the address location bits of the write and read commands are the same. It will be understood that error correction in read path 534 can include the application of an XOR (exclusive OR) tree to a corresponding H matrix to detect errors and selectively correct errors (in the case of a single bit error).

As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one embodiment, memory 520 includes syndrome decode 524, which enables the memory to apply check bits 556 to data 554 to detect errors in the read data. Syndrome decode 524 can generate syndrome 558 for use in generating appropriate error information for the read data. Data 554 can also be forwarded to error correction 528 for correction of a detected error.

In one embodiment, syndrome decode 524 passes syndrome 558 to syndrome generator 526 to generate an error vector. In one embodiment, check bit generator 522 and syndrome generator 526 are fully specified by a corresponding H matrix for the memory device. In one embodiment, if there are no errors in the read data (e.g., zero syndrome 558), syndrome generator 526 can generate a signal to cause data 554 to be written back to the memory. In one embodiment, if there is a single bit error (e.g., non-zero syndrome 558 that matches one of the columns of a corresponding H matrix), syndrome generator 526 can generate a CE (corrected error) signal with error location 564, which is a corrected error indication to error correction logic 528. Error correction 528 can apply the corrected error to the specified location in data 554 to generate corrected data 566 for writing back to the memory. In ECS mode, the ECC can check and scrub errors in memory locations with ECC operations.

Figure 6:
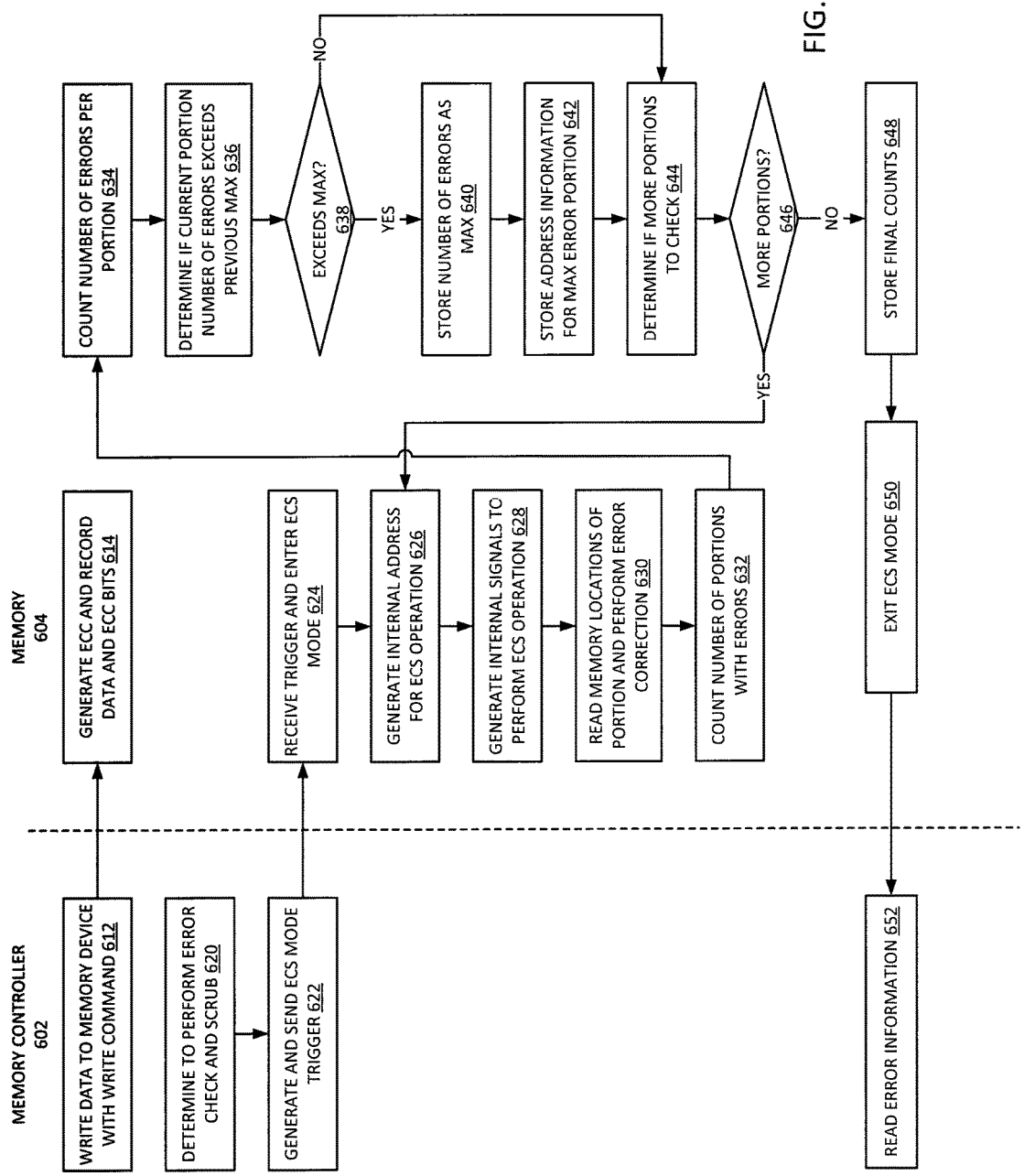
FIG. 6 is a flow diagram of an embodiment of a process for monitoring one or more error counts via error correction operations in an error check and scrub (ECS) mode.

FIG. 6 is a flow diagram of an embodiment of a process for monitoring one or more error counts via error correction operations in an error check and scrub (ECS) mode. The process for performing ECS operations can be performed in an embodiment of a memory subsystem that supports ECS mode as described herein. A memory subsystem includes memory controller 602 and memory 604. Memory 604 can be a memory device in accordance with any embodiment described herein. The memory enters ECS mode in response to a trigger. In ECS mode, the memory device checks for errors and corrects them, while counting error information that the memory controller can read.

In one embodiment, memory controller 602 writes data to the memory device with a write command, 612. In response to the write command, in one embodiment, memory 604 can generate internal error correction, including generating internal check bits. Memory 604 records or stores the data and corresponding ECC bits, 614. Memory 604 can later use the ECC bits to perform ECC operations, such as ECC operations in an ECS mode in accordance with any embodiment described herein.

In one embodiment, the memory controller determines to perform an error check and scrub (ECS), 620. Memory controller 602 generates and sends an ECS mode trigger, 622. In one embodiment, the ECS mode trigger is an ECS command that is a command sent with specific encoding to cause memory 604 to perform ECS operations. In one embodiment, the ECS mode trigger is one or more bits of a mode register. For example, memory controller 602 can perform a mode register set command to place the memory ECS mode. In response to the ECS mode trigger, the memory enters ECS mode, 624.

In one embodiment, the memory generates internal address information for the ECS operations, 626. For example, memory 604 can include an internal controller that manages the ECS operations, including the generation of address information. Such a controller can include one or more counters to track addresses for sequencing through the memory for ECS operation. The memory generates internal signals to perform the ECS operations, 628. The internal signals can include the specific operations to perform on the address locations for ECS mode, and can include generating and/or decoding address information for sequentially sequencing through the memory.

In one embodiment, the ECS operations include reading, correcting, and writing back data to a specified memory location. Thus, in one embodiment, the memory reads one or more memory locations of a portion of the memory (such as a row) and performs error correction on the memory locations, 630. The error correction can be ECC operations based on the stored ECC bits generated and stored with the data. The memory counts the number of portions with errors, 632. In one embodiment, the memory counts an error for every error found within the portion (e.g., within any addressable memory location of the memory portion). In one embodiment, the memory only counts an error for portions that have at least a threshold number of errors (e.g., 2). Thus, the memory can count an error for every N errors detected, or increment the count for every portion or segment having at least N errors. In one embodiment, the memory counts the number of errors per portion as well as the number of portions having errors, 634. The number of errors per portion indicates a maximum number of errors in any segment.

In one embodiment, the memory determines if a count of the number of errors per portion exceeds a previous maximum number of errors, 636. If the number of errors does not exceed the maximum, 638 NO branch, the memory can continue to sequence through the memory at 644. If the number of error exceeds the previous maximum, 638 YES branch, in one embodiment, the memory stores the number of errors as the maximum, 640, and stores the address information for the portion with the maximum error count, 642.

The memory can determine if there are more memory portions to check and scrub, 644. If there are more portions to check, 646 YES branch, the memory can generate a subsequent address for ECS operations, 626. If there are no more portions to check, 646 NO branch, in one embodiment, the memory stores the error count and maximum error counts, 648. For example, the memory can store the error information in one or more registers to be available for access by memory controller 602. The memory can exit ECS mode after completion of all checking, 650. In one embodiment, the memory controller accesses the error information, 652.

Figure 7:
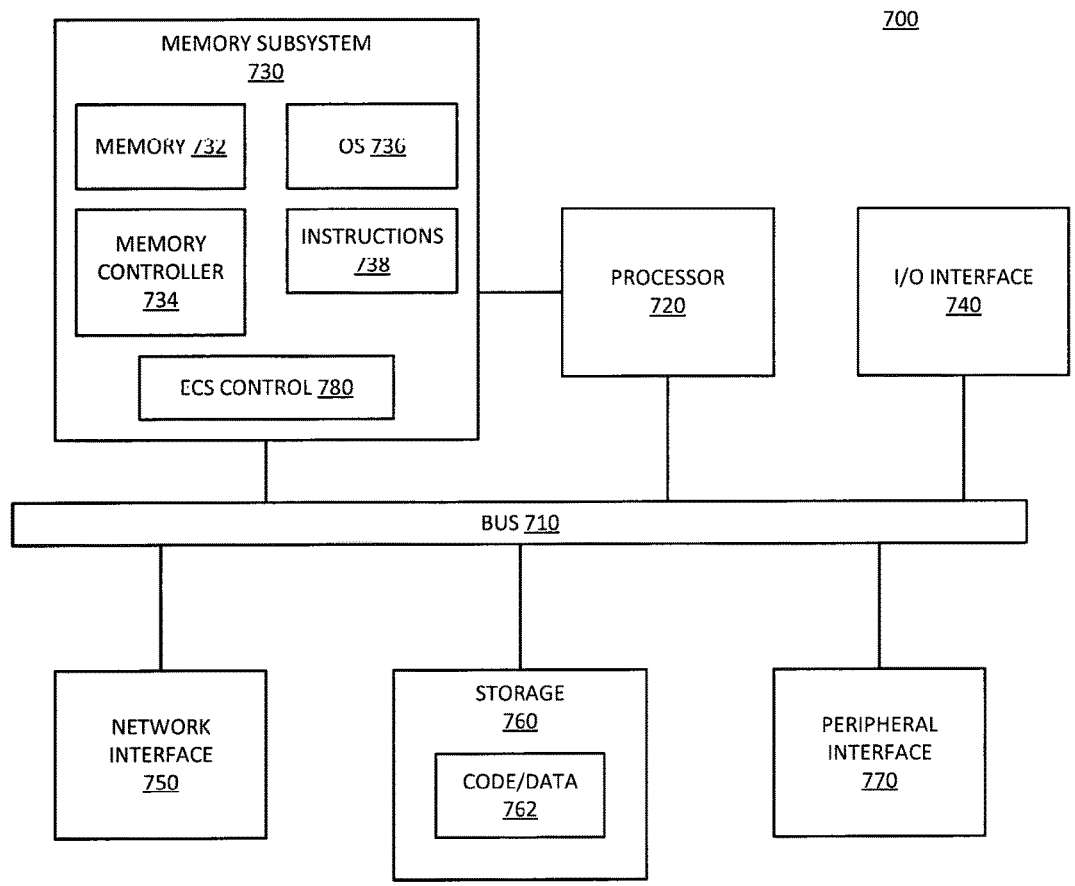
FIG. 7 is a block diagram of an embodiment of a computing system in which an error check and scrub mode with error tracking can be implemented.

FIG. 7 is a block diagram of an embodiment of a computing system in which an error check and scrub mode with error tracking can be implemented. System 700 represents a computing device in accordance with any embodiment described herein, and can be a laptop computer, a desktop computer, a server, a gaming or entertainment control system, a scanner, copier, printer, routing or switching device, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720. Memory subsystem 730 includes memory device 732 where it stores data, instructions, programs, or other items. In one embodiment, memory subsystem includes memory controller 734, which is a memory controller to generate and issue commands to memory device 732. It will be understood that memory controller 734 could be a physical part of processor 720.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

In one embodiment, memory 732 is a DRAM. In one embodiment, processor 720 represents one or more processors that execute data stored in one or more DRAM memories 732. In one embodiment, network interface 750 exchanges data with another device in another network location, and the data is data stored in memory 732. In one embodiment, system 700 includes ECS control 780 to manage ECS mode operation for the system. ECS control 780 represents ECS logic to perform ECS operations to check and correct errors internally within memory 732, and count error information in accordance with any embodiment described herein.

Figure 8:
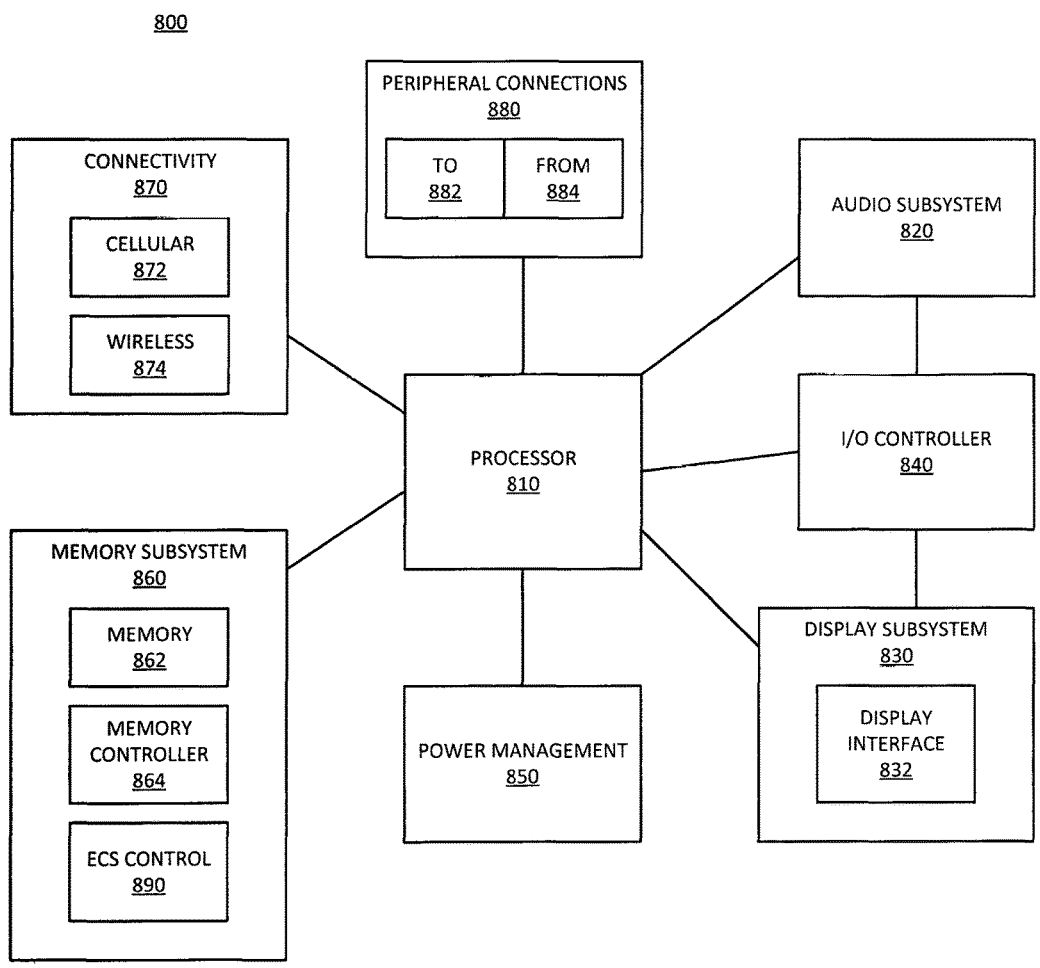
FIG. 8 is a block diagram of an embodiment of a mobile device in which an error check and scrub mode with error tracking can be implemented.

FIG. 8 is a block diagram of an embodiment of a mobile device in which an error check and scrub mode with error tracking can be implemented. Device 800 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user. In one embodiment, display subsystem 830 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features). In one embodiment, device 800 includes power management 850 that manages battery power usage, charging of the battery, and features related to power saving operation.

Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to memory device 862.

Connectivity 870 includes hardware devices (e.g., wireless and/or wired connectors and communication hardware) and software components (e.g., drivers, protocol stacks) to enable device 800 to communicate with external devices. The external device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory 862 is a DRAM. In one embodiment, processor 810 represents one or more processors that execute data stored in one or more DRAM memories 862. In one embodiment, system 800 includes ECS control 890 to manage ECS mode operation for the system. ECS control 890 represents ECS logic to perform ECS operations to check and correct errors internally within memory 862, and count error information in accordance with any embodiment described herein.

In one aspect, a dynamic random access memory device (DRAM) includes: a storage array including multiple memory segments, the memory segments including multiple memory locations to store data and error checking and correction (ECC) information associated with the data; I/O (input/output) circuitry to couple to an associated memory controller, the I/O circuitry to receive a trigger for an error check and scrub (ECS) mode when coupled to the associated memory controller; and an internal controller on the DRAM, responsive to the trigger for the ECS mode, to read one or more memory locations, perform ECC for the one or more memory locations based on the ECC information, and count error information, the error information including a segment count indicating a number of segments having N or more errors, and a maximum count indicating a maximum number of errors in any segment.

In one embodiment, the DRAM includes a double data rate version 4 extended (DDR4E) compliant synchronous dynamic random access memory device (SDRAM). In one embodiment, the memory segments comprise DRAM rows. In one embodiment, the trigger comprises an ECS command generated by the memory controller. In one embodiment, the trigger comprises a mode register setting set by the memory controller. In one embodiment, the internal controller is further to generate address information for the memory locations responsive to the trigger for the ECS mode. In one embodiment, memory controller is to identify a bank group associated with the trigger for the ECS mode, and wherein the internal controller is further to generate address information for specific rows within the bank group. In one embodiment, the internal controller is to perform single bit error (SBE) ECC for the one or more memory locations in response to the trigger for ECS mode. In one embodiment, N equals 1. In one embodiment, N equals 2. In one embodiment, further comprising the internal controller to store the segment count in a multipurpose register (MPR) of a mode register of the DRAM. In one embodiment, further comprising the internal controller to store an address of a segment having the maximum count, wherein the internal controller is to store the address in a multipurpose register (MPR) of a mode register of the DRAM.

In one aspect, a method for error correction management in a memory subsystem includes: receiving a trigger for an error check and scrub (ECS) mode at a memory device having a storage array including multiple memory segments, the memory segments including multiple memory locations to store data and error checking and correction (ECC) information associated with the data; reading one or more of the memory locations responsive to receiving the trigger for the ECS mode; performing ECC for the one or more memory locations based on the ECC information; and counting error information, the error information including a segment count indicating a number of segments having at least a threshold number of errors, and a maximum count indicating a maximum number of errors in any segment.

In one embodiment, the memory device includes a double data rate version 4 extended (DDR4E) compliant synchronous dynamic random access memory device (SDRAM). In one embodiment, the memory segments comprise DRAM rows. In one embodiment, receiving the trigger comprises receiving an ECS command generated by the memory controller. In one embodiment, receiving the trigger comprises receiving a mode register setting set by the memory controller. In one embodiment, further comprising generating address information for the memory locations responsive to the trigger for the ECS mode. In one embodiment, further comprising identifying a bank group associated with the trigger for the ECS mode, and generating address information for specific rows within the bank group. In one embodiment, performing ECC comprises performing single bit error (SBE) ECC for the one or more memory locations in response to the trigger for ECS mode. In one embodiment, the threshold number equals 1. In one embodiment, the threshold number equals 2. In one embodiment, further comprising storing the segment count in a multipurpose register (MPR) of a mode register of the memory device. In one embodiment, further comprising storing an address of a segment having the maximum count. In one embodiment, further comprising storing the segment count in a multipurpose register (MPR) of a mode register of the memory device; and storing an address of a segment having the maximum count.

In one aspect, a system with a memory subsystem includes: a memory controller; and multiple double data rate version 4 extended (DDR4E) synchronous dynamic random access memory devices (SDRAMs) including a storage array including multiple memory segments, the memory segments including multiple memory locations to store data and error checking and correction (ECC) information associated with the data; I/O (input/output) circuitry coupled to the memory controller, the I/O circuitry to receive a trigger for an error check and scrub (ECS) mode from the memory controller; and an internal controller, responsive to the trigger for the ECS mode, to read one or more memory locations, perform ECC for the one or more memory locations based on the ECC information, and count error information, the error information including a segment count indicating a number of segments having N or more errors, and a maximum count indicating a maximum number of errors in any segment.

In one embodiment, the DRAM includes a double data rate version 4 extended (DDR4E) compliant synchronous dynamic random access memory device (SDRAM). In one embodiment, the memory segments comprise DRAM rows. In one embodiment, the trigger comprises an ECS command generated by the memory controller. In one embodiment, the trigger comprises a mode register setting set by the memory controller. In one embodiment, the internal controller is further to generate address information for the memory locations responsive to the trigger for the ECS mode. In one embodiment, memory controller is to identify a bank group associated with the trigger for the ECS mode, and wherein the internal controller is further to generate address information for specific rows within the bank group. In one embodiment, the internal controller is to perform single bit error (SBE) ECC for the one or more memory locations in response to the trigger for ECS mode. In one embodiment, N equals 1. In one embodiment, N equals 2. In one embodiment, further comprising the internal controller to store the segment count in a multipurpose register (MPR) of a mode register of the DRAM. In one embodiment, further comprising the internal controller to store the segment count in a multipurpose register (MPR) of a mode register of the SDRAM, and to store an address of a segment having the maximum count. In one embodiment, further comprising one or more of: at least one processor communicatively coupled to the memory controller; a display communicatively coupled to at least one processor; or a network interface communicatively coupled to at least one processor.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory device (DRAM), comprising:
   a storage array including multiple memory segments, the memory segments including multiple memory locations to store data and error checking and correction (ECC) information associated with the data;
   I/O (input/output) circuitry to couple to an associated memory controller, the I/O circuitry to receive a trigger for an error check and scrub (ECS) mode when coupled to the associated memory controller; and
   an internal controller on the DRAM, responsive to the trigger for the ECS mode, to ignore data and address inputs on the I/O circuitry for a delay period following entry into the ECS mode after the trigger, and to read one or more memory locations of the multiple memory locations, perform ECC for the one or more memory locations based on the ECC information associated with the data of the one or more memory locations, and record error information for the multiple memory segments, including a segment count and a maximum count, wherein the segment count is to indicate a number of memory segments having N or more errors, wherein N is an integer equal to or greater than 1, and wherein the maximum count is to indicate a number of errors in a memory segment of the multiple memory segments with a highest number of errors.

2. The DRAM of claim 1, wherein the DRAM includes a synchronous dynamic random access memory device (SDRAM) compatible with a double data rate version 4 (DDR4) standard.

3. The DRAM of claim 1, wherein the memory segments comprise DRAM rows.

4. The DRAM of claim 1, wherein the trigger comprises an ECS command generated by the memory controller.

5. The DRAM of claim 1, wherein the trigger comprises a mode register setting set by the memory controller.

6. The DRAM of claim 1, wherein the internal controller is further to generate address information for the memory locations responsive to the trigger for the ECS mode.

7. The DRAM of claim 1, wherein memory controller is to identify a bank group associated with the trigger for the ECS mode, and wherein the internal controller is further to generate address information for specific rows within the bank group.

8. The DRAM of claim 1, wherein the internal controller is to perform single bit error (SBE) ECC for the one or more memory locations in response to the trigger for ECS mode.

9. The DRAM of claim 1, wherein N equals 1.

10. The DRAM of claim 1, wherein N equals 2.

11. The DRAM of claim 1, further comprising the internal controller to store the segment count in a multipurpose register (MPR) of a mode register of the DRAM.

12. The DRAM of claim 1, further comprising the internal controller to store an address of a segment having the maximum count, wherein the internal controller is to store the address in a multipurpose register (MPR) of a mode register of the DRAM.

13. A method for error correction management in a memory subsystem, comprising:
   receiving a trigger for an error check and scrub (ECS) mode at a memory device having a storage array including multiple memory segments, the memory segments including multiple memory locations to store data and error checking and correction (ECC) information associated with the data;
   ignoring data and address inputs for a delay period following entry into the ECS mode after the trigger;
   reading one or more of the memory locations of the multiple memory locations responsive to receiving the trigger for the ECS mode;
   performing ECC for the one or more memory locations based on the ECC information associated with the data of the one or more memory locations; and
   recording error information for the multiple memory segments, including a segment count and a maximum count, wherein the segment count indicates indicating a number of memory segments having N or more errors, wherein N is an integer equal to or greater than 1, and wherein the maximum count indicates a number of errors in a memory segment of the multiple memory segments with a highest number of errors.

14. The method of claim 13, wherein the memory device includes a synchronous dynamic random access memory device (SDRAM) compatible with a double data rate version 4 (DDR4) standard.

15. The method of claim 13, wherein receiving the trigger comprises receiving an ECS command generated by an associated memory controller or receiving a mode register setting set by the memory controller.

16. The method of claim 13, wherein N equals 1 or 2.

17. The method of claim 13, further comprising
   storing the segment count in a multipurpose register (MPR) of a mode register of the memory device; and
   storing an address of a segment having the maximum count.

18. A system with a memory subsystem, comprising:
a memory controller; and
multiple double data rate version 4 (DDR4) synchronous dynamic random access memory devices (SDRAMs) including
   a storage array including multiple memory segments, the memory segments including multiple memory locations to store data and error checking and correction (ECC) information associated with the data;
   I/O (input/output) circuitry coupled to the memory controller, the I/O circuitry to receive a trigger for an error check and scrub (ECS) mode from the memory controller; and
   an internal controller, responsive to the trigger for the ECS mode, to ignore data and address inputs on the I/O circuitry for a delay period following entry into the ECS mode after the trigger, and to read one or more memory locations of the multiple memory locations, perform ECC for the one or more memory locations based on the ECC information associated with the data of the one or more memory locations, and record error information for the multiple memory segments, including a segment count and a maximum count, wherein the segment count is to indicate a number of memory segments having N or more errors, wherein N is an integer equal to or greater than 1, and wherein the maximum count is to indicate a number of errors in a memory segment of the multiple memory segments with a highest number of errors.

19. The system of claim 18, wherein the trigger comprises an ECS command generated by the memory controller, or a mode register setting set by the memory controller.

20. The system of claim 18, wherein the internal controller is further to generate address information for the memory locations responsive to the trigger for the ECS mode.

21. The system of claim 18, wherein N equals 1 or 2.

22. The system of claim 18, further comprising the internal controller to store the segment count in a multipurpose register (MPR) of a mode register of the SDRAM, and to store an address of a segment having the maximum count.

23. The system of claim 18, further comprising one or more of:
- at least one processor communicatively coupled to the memory controller;
- a display communicatively coupled to at least one processor; or
- a network interface communicatively coupled to at least one processor.

* * * * *